United States Patent
Harada et al.

(10) Patent No.: US 10,604,842 B2
(45) Date of Patent: Mar. 31, 2020

(54) METHOD OF MANUFACTURING SEMICONDUCTOR DEVICE, SUBSTRATE PROCESSING APPARATUS, AND RECORDING MEDIUM

(71) Applicant: KOKUSAI ELECTRIC CORPORATION, Tokyo (JP)

(72) Inventors: Katsuyoshi Harada, Toyama (JP); Yushin Takasawa, Toyama (JP); Satoshi Shimamoto, Toyama (JP); Shin Sone, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 16/359,884

(22) Filed: Mar. 20, 2019

(65) Prior Publication Data

US 2019/0218666 A1 Jul. 18, 2019

Related U.S. Application Data

(63) Continuation of application No. PCT/JP2016/077962, filed on Sep. 23, 2016.

(51) Int. Cl.
*C23C 16/455* (2006.01)
*C23C 16/52* (2006.01)
(Continued)

(52) U.S. Cl.
CPC ...... *C23C 16/45565* (2013.01); *C23C 16/455* (2013.01); *C23C 16/52* (2013.01);
(Continued)

(58) Field of Classification Search
None
See application file for complete search history.

(56) References Cited

U.S. PATENT DOCUMENTS

| 8,822,350 B2 * | 9/2014 | Yuasa | C23C 16/40 438/584 |
| 8,916,477 B2 * | 12/2014 | Thedjoisworo | H01L 21/3065 216/37 |

(Continued)

FOREIGN PATENT DOCUMENTS

| JP | H06-069195 A | 3/1994 |
| JP | 2014-216342 A | 11/2014 |

OTHER PUBLICATIONS

International Search Report for PCT/JP2016/077962, dated Dec. 20, 2016.

*Primary Examiner* — Allan W. Olsen
(74) *Attorney, Agent, or Firm* — Volpe and Koenig, P.C.

(57) ABSTRACT

There is provided a technique that includes: (a) supplying a hydrogen gas to a substrate set to a first temperature, without supplying any oxygen-containing gas; (b) changing a temperature of the substrate from the first temperature to a second temperature, which is higher than the first temperature, while the hydrogen gas is supplied to the substrate, without supplying any oxygen-containing gas; and (c) forming an oxide film on the substrate, on which (a) and (b) have been performed, by alternately repeating, while the temperature of the substrate is maintained at the second temperature: supplying a precursor gas to the substrate; and supplying an oxygen-containing gas to the substrate, without supplying any hydrogen-containing gas.

15 Claims, 8 Drawing Sheets

(51) Int. Cl.
*H01L 21/02* (2006.01)
*H01L 21/31* (2006.01)
*H01L 29/66* (2006.01)

(52) U.S. Cl.
CPC ...... *H01L 21/0214* (2013.01); *H01L 21/0228* (2013.01); *H01L 21/02126* (2013.01); *H01L 21/02164* (2013.01); *H01L 21/02216* (2013.01); *H01L 21/02222* (2013.01); *H01L 21/31* (2013.01); *H01L 29/66795* (2013.01)

(56) References Cited

U.S. PATENT DOCUMENTS

| | | | |
|---|---|---|---|
| 9,006,116 B2 * | 4/2015 | Terasaki | C23C 16/402 438/787 |
| 9,202,708 B1 * | 12/2015 | Chen | H01J 37/32357 |
| 9,236,266 B2 * | 1/2016 | Zhang | H01L 21/3065 |
| 9,558,928 B2 * | 1/2017 | Thedjoisworo | H01L 21/02063 |
| 10,283,615 B2 * | 5/2019 | Yang | H01L 21/02068 |
| 2013/0280919 A1 * | 10/2013 | Yuasa | C23C 16/40 438/778 |
| 2013/0298942 A1 * | 11/2013 | Ren | H01L 21/76814 134/1.2 |
| 2014/0099797 A1 * | 4/2014 | Terasaki | C23C 16/402 438/787 |
| 2014/0166617 A1 * | 6/2014 | Chen | H01L 21/31122 216/67 |
| 2014/0315393 A1 | 10/2014 | Ozaki et al. | |
| 2016/0093505 A1 * | 3/2016 | Chen | H01L 21/31116 438/723 |

* cited by examiner

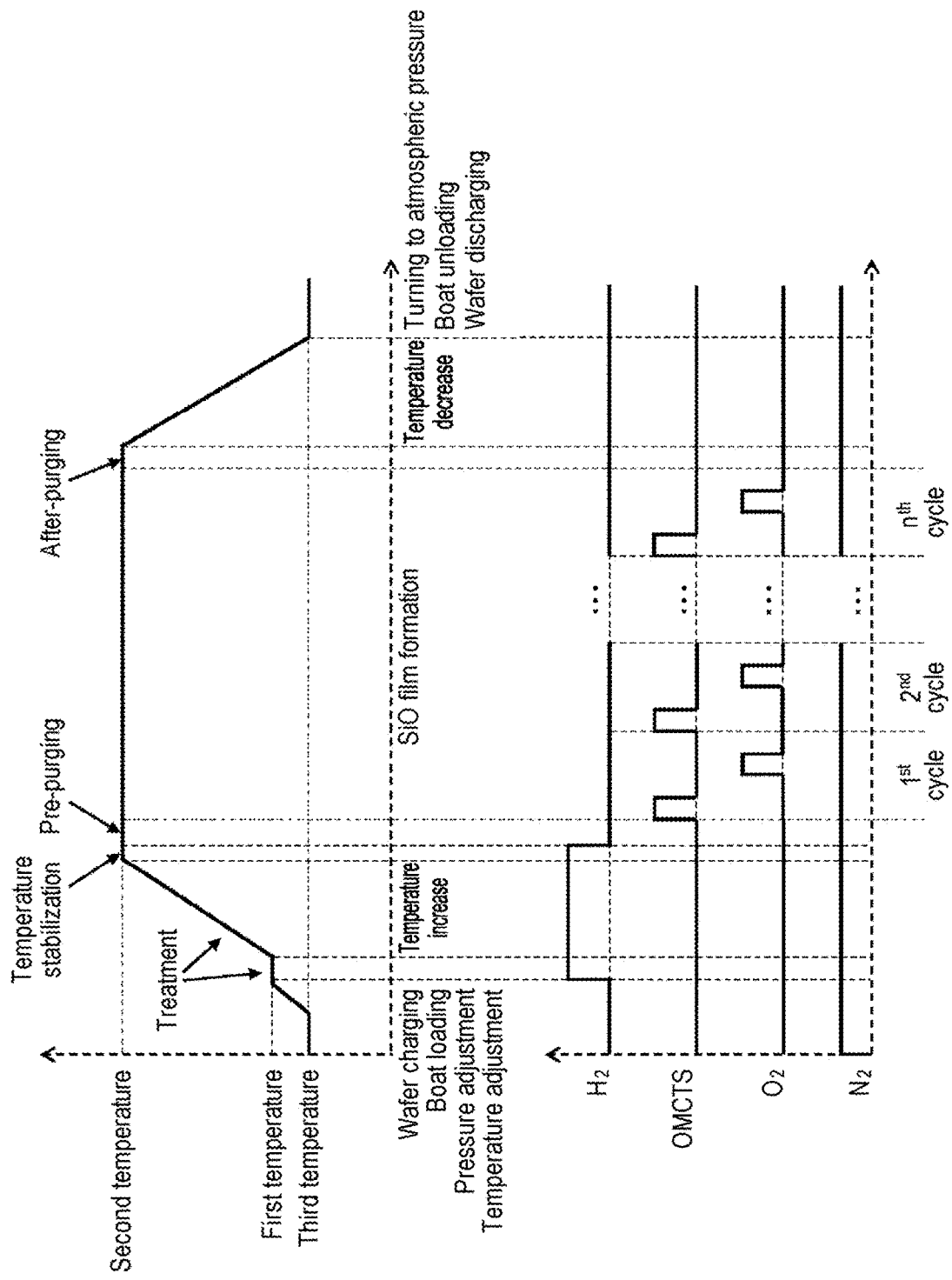

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION

This application is a Bypass Continuation Application of PCT International Application No. PCT/JP2016/077962, filed on Sep. 23, 2016, the entire contents of which are incorporated herein by reference.

TECHNICAL FIELD

The present disclosure relates to a method of manufacturing a semiconductor device, a substrate processing apparatus, and a recording medium.

BACKGROUND

In the related art, as a process of manufacturing a semiconductor device, a process of forming (depositing) an oxide film on a heated substrate by supplying a precursor gas and an oxygen (O)-containing gas to the substrate may be carried out.

SUMMARY

Some embodiments of the present disclosure provide a technique capable of suppressing oxidation of a substrate as a base when an oxide film is formed on the substrate.

According to one of the embodiments of the present disclosure, there is provided a technique that includes: (a) supplying a hydrogen gas to a substrate set to a first temperature, without supplying any oxygen-containing gas; (b) changing a temperature of the substrate from the first temperature to a second temperature, which is higher than the first temperature, while the hydrogen gas is supplied to the substrate, without supplying any oxygen-containing gas; and (c) forming an oxide film on the substrate, on which (a) and (b) have been performed, by alternately repeating, while the temperature of the substrate is maintained at the second temperature: supplying a precursor gas to the substrate; and supplying an oxygen-containing gas to the substrate, without supplying any hydrogen-containing gas.

BRIEF DESCRIPTION OF DRAWINGS

FIG. 4 is a diagram showing a film-forming sequence according to the embodiments of the present disclosure.

DETAILED DESCRIPTION

One or More Embodiments of the Present Disclosure

Figure 1:
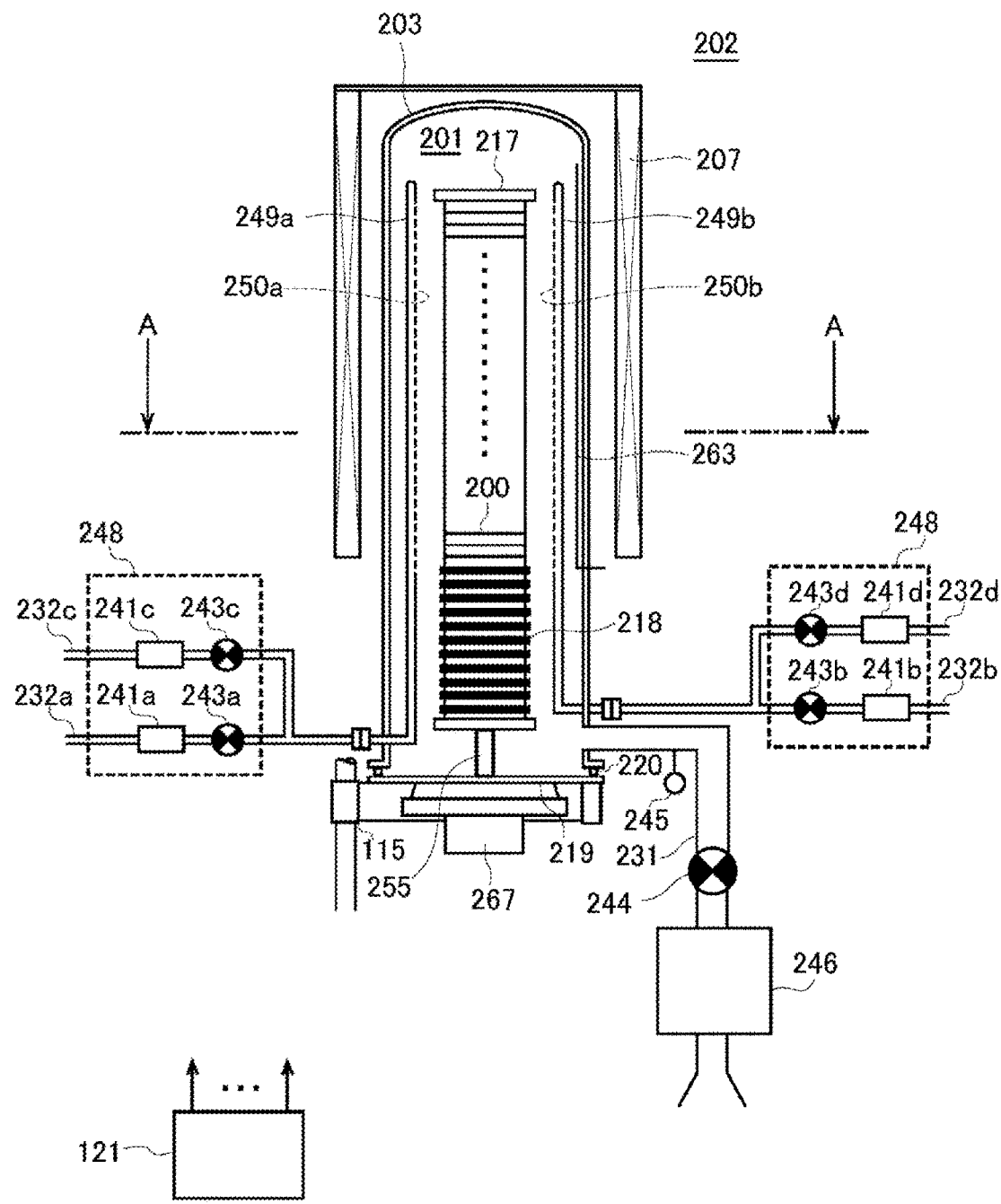
FIG. 1 is a schematic configuration view of a vertical process furnace of a substrate processing apparatus suitably used in one or more embodiments of the present disclosure, in which a portion of the process furnace is shown in a vertical cross section.
Figure 2:
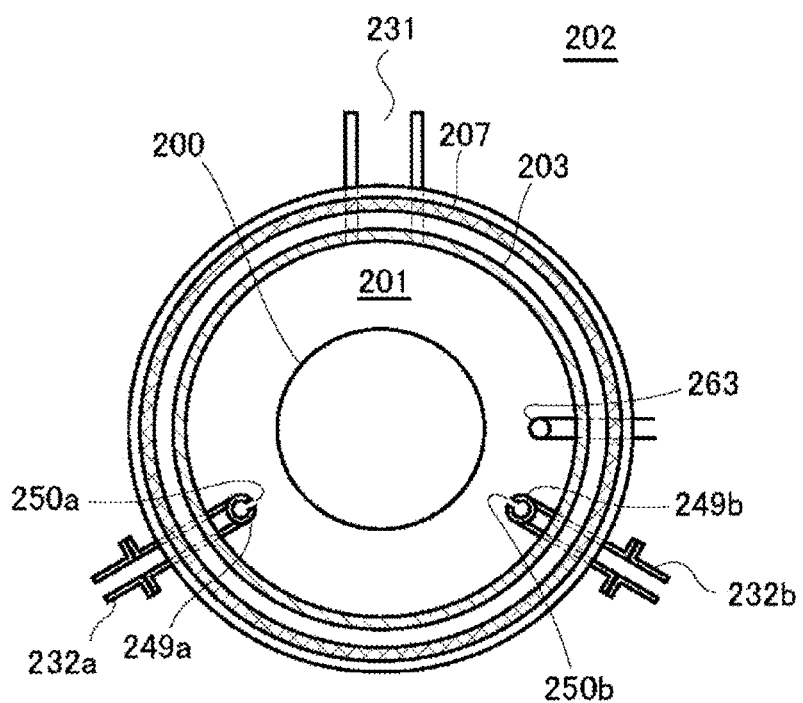
FIG. 2 is a schematic configuration view of the vertical process furnace of the substrate processing apparatus suitably used in the embodiments of the present disclosure, in which a portion of the process furnace is shown in a cross section taken along line A-A in FIG. 1.
Figure 3:
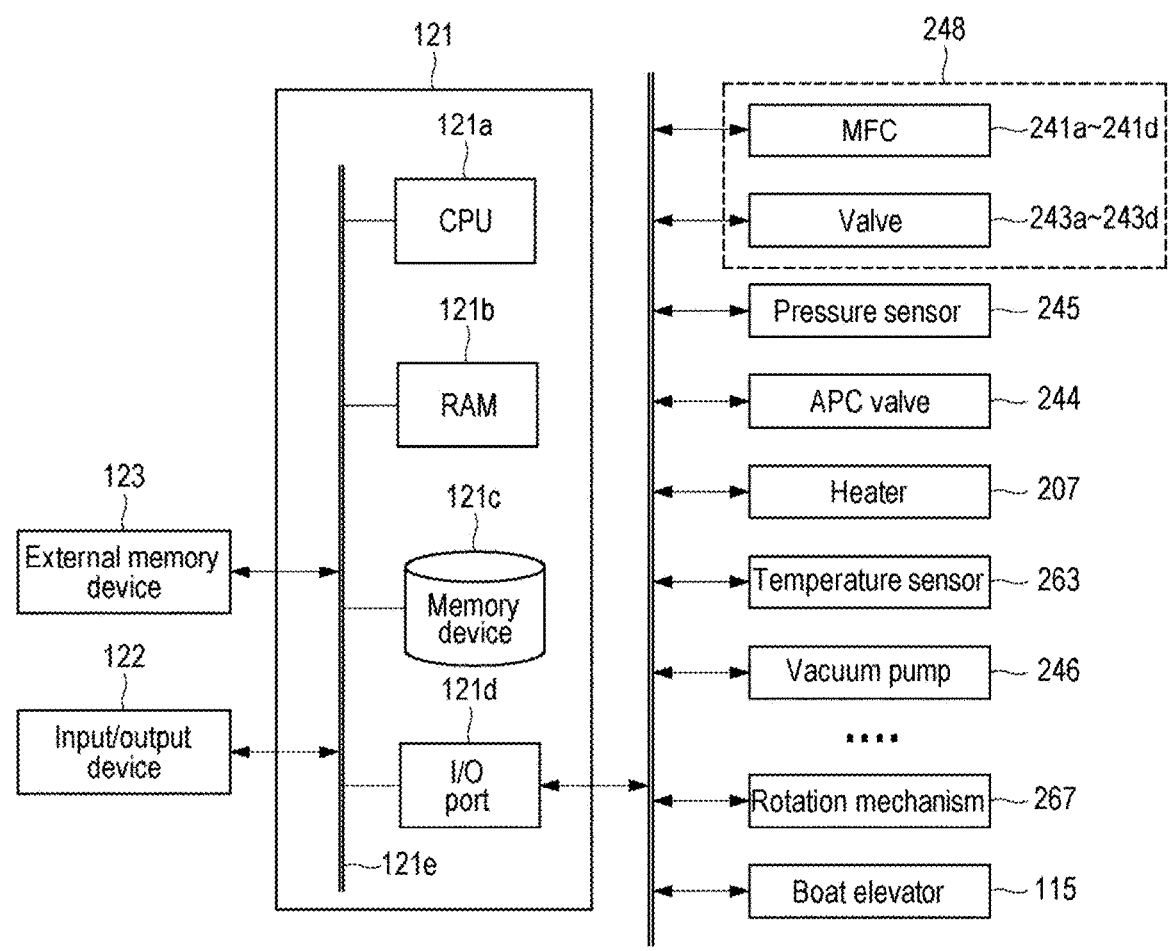
FIG. 3 is a schematic configuration diagram of a controller of the substrate processing apparatus suitably used in the embodiments of the present disclosure, in which a control system of the controller is shown in a block diagram.

The embodiments of the present disclosure will be now described mainly with reference to FIGS. 1 to 3.

(1) Configuration of Substrate Processing Apparatus

As shown in FIG. 1, a process furnace 202 includes a heater 207 as a heating part (a heating mechanism). The heater 207 has a cylindrical shape and is supported by a support plate so as to be vertically installed. The heater 207 functions as an activation mechanism (an excitation part) configured to thermally activate (excite) a gas.

A reaction tube 203 constituting a reaction container (a processing container) is disposed inside the heater 207 in a concentric relationship with the heater 207. The reaction tube 203 is made of a heat resistant material such as quartz ($SiO_2$) or silicon carbide (SiC), and is formed in a cylindrical shape with its upper end closed and its lower end opened. A process chamber 201 is formed in the hollow cylindrical portion of the reaction tube 203. The process chamber 201 is configured to accommodate wafers 200 as substrates.

Nozzles 249a and 249b are installed in the process chamber 201 so as to pass through the lower side wall of the reaction tube 203. Gas supply pipes 232a and 232b are connected to the nozzles 249a and 249b, respectively.

Mass flow controllers (MFCs) 241a and 241b, which are flow rate controllers (flow rate control parts), and valves 243a and 243b, which are opening/closing valves, are installed in the gas supply pipes 232a and 232b, respectively, in order from the upstream side of gas flow. Gas supply pipes 232c and 232d for supplying an inert gas are connected to the downstream side of the valves 243a and 243b of the gas supply pipes 232a and 232b, respectively. MFCs 241c and 241d and valves 243c and 243d are installed in the gas supply pipes 232c and 232d, respectively, in order from the upstream side of gas flow.

As shown in FIG. 2, the nozzles 249a and 249b are disposed in an annular space between the inner wall of the reaction tube 203 and the wafers 200 such that the nozzles 249a and 249b extend upward along a stack direction of the wafers 200 from a lower portion of the inner wall of the reaction tube 203 to an upper portion thereof. Specifically, the nozzles 249a and 249b are installed in a region horizontally surrounding a wafer arrangement region in which the wafers 200 are arranged at a lateral side of the wafer arrangement region, along the wafer arrangement region. Gas supply holes 250a and 250b for supplying a gas are formed on the side surfaces of the nozzles 249a and 249b, respectively. The gas supply holes 250a and 250b are opened toward the center of the reaction tube 203 to allow the gas to be supplied toward the wafers 200. A plurality of gas supply holes 250a and 250b may be formed between the lower portion of the reaction tube 203 and the upper portion thereof.

A precursor (precursor gas), for example, a siloxane-based precursor gas (siloxane compound) containing silicon (Si) as a predetermined element (main element) and oxygen (O), is supplied from the gas supply pipe 232a into the process chamber 201 via the MFC 241a, the valve 243a and the nozzle 249a. The precursor gas is a gaseous gas, for example, a gas obtained by vaporizing a precursor in a liquid state under normal temperature and normal pressure, or a precursor in a gaseous state under normal temperature and normal pressure. The siloxane compound is a compound having Si and O as a skeleton and is a generic term for those having a Si—O—Si bond (siloxane bond). The siloxane compound acts not only as a Si source but also as an O source. A certain siloxane compound acts as a C source as well as the Si source and the O source, like an organic siloxane compound.

Figure 5A:
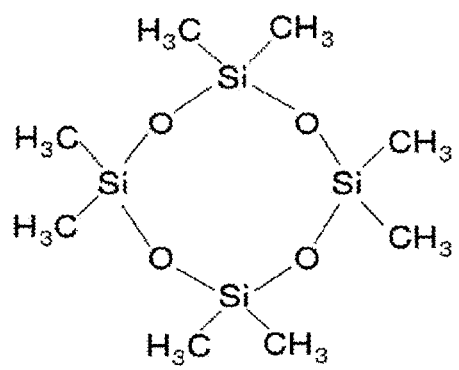
FIGS. 5A and 5B are views showing a chemical structural formula of octamethylcyclotetrasiloxane and a chemical structural formula of hexamethyldisiloxane, respectively.
Figure 5B:
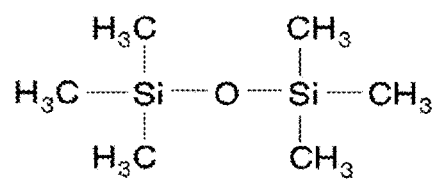

As the siloxane compound, it may be possible to use, e.g., an organic siloxane compound having a cyclic structure including an alkyl group (herein, a methyl group), such as an octamethylcyclotetrasiloxane ($[[(CH_3)_2Si]O]_4$, abbreviation: OMCTS) gas, and an organic siloxane compound having a chain structure including an alkyl group (herein, a methyl group), such as a hexamethyldisiloxane ($[(CH_3)_3Si]_2O$, abbreviation: HMDSO) gas or a tetramethyldisiloxane ($[H(CH_3)_2Si]_2O$, abbreviation: TMDSO) gas. FIG. 5A shows the chemical structural formula of OMCTS, and FIG. 5B shows the chemical structural formula of HMDSO.

In addition, as the siloxane compound, it may be also possible to use, e.g., an inorganic siloxane compound having a cyclic structure including a halogen group (herein, a chloro group), such as an octachlorocyclotetrasiloxane ($(Cl_2SiO)_4$, abbreviation: OCCTS) gas, and an inorganic siloxane compound having a chain structure including a halogen group (herein, a chloro group), such as a hexachlorodisiloxane ($(Cl_3Si)_2O$, abbreviation: HCDSO) gas or a tetrachlorodisiloxane ($(HCl_2Si)_2O$, abbreviation: TCDSO) gas.

A precursor (precursor gas), for example, a silazane-based precursor gas (silazane compound) containing silicon (Si) as a predetermined element (main element) and nitrogen (N), is supplied from the gas supply pipe 232a into the process chamber 201 via the MFC 241a, the valve 243a and the nozzle 249a. The silazane compound is a compound having Si and N as a skeleton and is a generic term for those having a Si—N—Si bond or a Si—N bond. The silazane compound acts not only as a Si source but also as a N source. A certain silazane compound acts as a C source as well as the Si source and the N source, like an organic silazane compound.

Figure 6A:
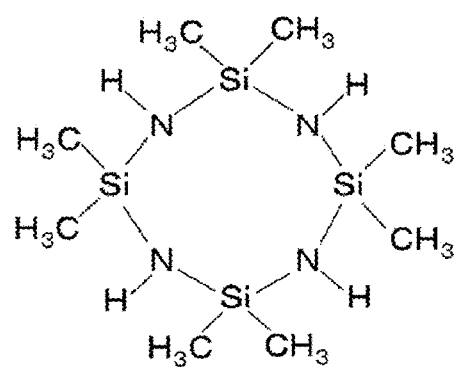
FIGS. 6A and 6B are views showing a chemical structural formula of octamethylcyclotetrasilazane and a chemical structural formula of hexamethyldisilazane, respectively.
Figure 6B:
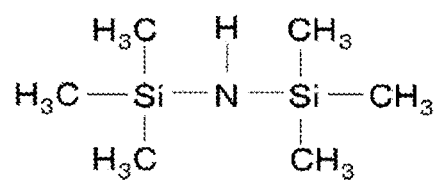

As the silazane compound, it may be possible to use, e.g., an organic silazane compound having a cyclic structure including an alkyl group (herein, a methyl group), such as an octamethylcyclotetrasilazane ($[[(CH_3)_2Si]N]_4$, abbreviation: OMCTSN) gas, and an organic silazane compound having a chain structure including an alkyl group (herein, a methyl group), such as a hexamethyldisilazane ($[(CH_3)_3Si]_2N$, abbreviation: HMDSN) gas or a tetramethyldisilazane ($[H(CH_3)_2Si]_2N$, abbreviation: TMDSN) gas. FIG. 6A shows the chemical structural formula of OMCTSN, and FIG. 6B shows the chemical structural formula of HMDSN.

In addition, as the silazane compound, it may be also possible to use, e.g., an inorganic silazane compound having a cyclic structure including a halogen group (herein, a chloro group), such as an octachlorocyclotetrasilazane ($(Cl_2SiN)_4$, abbreviation: OCCTSN) gas, and an inorganic silazane compound having a chain structure including a halogen group (herein, a chloro group), such as a hexachlorodisilazane ($(Cl_3Si)_2N$, abbreviation: HCDSN) gas or a tetrachlorodisilazane ($(HCl_2Si)_2N$, abbreviation: TCDSN) gas.

A reactant (reactant gas), for example, an oxygen ($O_2$) gas, which is an oxygen (O)-containing gas (oxidizing agent), is supplied from the gas supply pipe 232b into the process chamber 201 via the MFC 241b, the valve 243b and the nozzle 249b. The $O_2$ gas acts as an O source.

A hydrogen ($H_2$) gas is supplied from the gas supply pipe 232b into the process chamber 201 via the MFC 241b, the valve 243b and the nozzle 249b. The $H_2$ gas acts as an oxidation-inhibiting gas (treatment gas) for inhibiting oxidation of the surface of a wafer 200 which is the base of a film-forming process.

An inert gas, for example, a nitrogen ($N_2$) gas, is supplied from the gas supply pipes 232c and 232d into the process chamber 201 via the MFCs 241c and 24 d, the valves 243c and 243d, the gas supply pipes 232a and 232b and the nozzles 249a and 249b.

A precursor gas supply system mainly includes the gas supply pipe 232a, the MFC 241a and the valve 243a. An O-containing gas supply system and a $N_2$ gas supply system mainly include the gas supply pipe 232b, the MFC 241b and the valves 243b. An inert gas supply system mainly includes the gas supply pipes 232c and 232d, the MFCs 241c and 241d and the valves 243c and 243d.

Either or all of the above-described various supply systems may be configured as an integrated supply system 248 in which the valves 243a to 243d, the MFCs 241a to 241d and the like are integrated. The integrated supply system 248 is connected to each of the gas supply pipes 232a to 232d, and is configured such that the operations of supplying various gases into the gas supply pipes 232a to 232d, such as the opening and closing operation of the valves 243a to 243d and the flow rate-regulating operation by the MFCs 241a to 241d, and the like, are controlled by a controller 121 which will be described below. The integrated supply system 248 is configured as an integral type or division type integrated unit and can be attached to and detached from the gas supply pipes 232a to 232d or the like on an integrated unit basis. Further, the maintenance, replacement, expansion and the like of the integrated supply system 248 can be performed on an integrated unit basis.

An exhaust pipe 231 for exhausting the internal atmosphere of the process chamber 201 is installed in the reaction tube 203. An exhaust device, e.g., a vacuum pump 246, is connected to the exhaust pipe 231 via a pressure sensor 245, which is a pressure detector (pressure detecting part) for detecting the internal pressure of the process chamber 201, and an auto pressure controller (APC) valve 244, which is a pressure regulator (pressure regulating part). The APC valve 244 is configured to perform or stop vacuum exhaust in the process chamber 201 by opening or closing the valve while the vacuum pump 246 is actuated, and is also configured to regulate the internal pressure of the process chamber 201 by adjusting the opening degree of the valve based on pressure information detected by the pressure sensor 245 while the vacuum pump 246 is actuated. An exhaust system mainly includes the exhaust pipe 231, the APC valve 244 and the pressure sensor 245. The vacuum pump 246 may be included in the exhaust system.

A seal cap 219, which serves as a furnace opening cover configured to hermetically seal the lower end opening of the reaction tube 203, is installed under the reaction tube 203. The seal cap 219 is made of metal such as, e.g., SUS or the like, and is formed in a disc shape. An O-ring 220, which is a seal member making contact with the lower end of the reaction tube 203, is installed on the upper surface of the seal cap 219. A rotation mechanism 267 configured to rotate a boat 217, which will be described below, is installed under the seal cap 219. A rotary shaft 255 of the rotation mechanism 267, which penetrates through the seal cap 219, is connected to the boat 217. The rotation mechanism 267 is configured to rotate the wafers 200 by rotating the boat 217. The seal cap 219 is configured to be vertically moved up and down by a boat elevator 115 which is an elevating instrument installed outside the reaction tube 203. The boat elevator 115 is configured as a transfer device (transfer mechanism) which loads and unloads (transfers) the wafers 200 into and from the process chamber 201 by moving the seal cap 219 up and down.

The boat 217 serving as a substrate support is configured to support a plurality of wafers 200, e.g., 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is made of a heat resistant material such as quartz or SiC. Heat-insulating plates 218 made of a heat resistant material such as quartz or SiC are installed below the boat 217 in a horizontal posture and in multiple stages.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. The temperature sensor 263 is installed along the inner wall of the reaction tube 203.

As illustrated in FIG. 3, a controller 121, which is a control part (control unit), may be configured as a computer including a central processing unit (CPU) 121a, a random access memory (RAM) 121b, a memory device 121c and an I/O port 121d. The RAM 121b, the memory device 121c and the I/O port 121d are configured to exchange data with the CPU 121a via an internal bus 121e. An input/output device 122 formed of, e.g., a touch panel or the like, is connected to the controller 121.

The memory device 121c is configured with, for example, a flash memory, a hard disk drive (HDD) or the like. A control program for controlling operations of a substrate processing apparatus and a process recipe, in which sequences and conditions of substrate processing to be described below are written, are readably stored in the memory device 121c. The process recipe functions as a program for causing the controller 121 to execute each sequence in the substrate-processing process, which will be described below, to obtain a predetermined result. Hereinafter, the process recipe and the control program will be generally and simply referred to as a "program." Furthermore, the process recipe will be simply referred to as a "recipe." When the term "program" is used herein, it may indicate a case of including only the recipe, a case of including only the control program, or a case of including both the recipe and the control program. The RAM 121b is configured as a memory area (work area) in which a program or data read by the CPU 121a is temporarily stored.

The I/O port 121d is connected to the MFCs 241a to 241d, the valves 243a to 243d, the pressure sensor 245, the APC valve 244, the vacuum pump 246, the heater 207, the temperature sensor 263, the rotation mechanism 267, the boat elevator 115, and so on.

The CPU 121a is configured to read and execute the control program from the memory device 121c. The CPU 121a is also configured to read the recipe from the memory device 121c according to an input of an operation command from the input/output device 122. The CPU 121a is configured to control the flow rate-adjusting operation of various kinds of gases by the MFCs 241a to 241d, the opening/closing operation of the valves 243a to 243d, the opening/closing operation of the APC valve 244, the pressure-regulating operation performed by the APC valve 244 based on the pressure sensor 245, the driving and stopping of the vacuum pump 246, the temperature-adjusting operation performed by the heater 207 based on the temperature sensor 263, the operations of rotating the boat 217 with the rotation mechanism 267 and adjusting the rotation speed of the boat 217, the operation of moving the boat 217 up and down with the boat elevator 115, and so on, according to contents of the read recipe.

The controller 121 may be configured by installing, on a computer, the aforementioned program stored in an external memory device 123 (for example, a magnetic disk such as a hard disk, an optical disk such as a CD, a magneto-optical disk such as an MO, a semiconductor memory such as a USB memory, or the like). The memory device 121c or the external memory device 123 is configured as a non-transitory computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Alternatively, the program may be supplied to the computer using communication means such as the Internet or a dedicated line, instead of using the external memory device 123.

(2) Substrate Processing Process

A sequence example of forming a silicon oxide film (SiO film) on a wafer 200 as a substrate using the aforementioned substrate processing apparatus, which is a process for manufacturing a semiconductor device, will be described below with reference to FIG. 4. In the following description, the operations of the respective parts constituting the substrate processing apparatus are controlled by the controller 121.

The film-forming sequence shown in FIG. 4 includes: a step A of supplying a H$_2$ gas to a wafer 200 set to a first temperature, without supplying an O$_2$ gas; a step B of changing a temperature of the wafer 200 from the first temperature to a second temperature, which is higher than the first temperature, while the H$_2$ gas is supplied to the wafer 200, without supplying the O$_2$ gas; and a step C of forming a SiO film on the wafer 200, on which the steps A and B have been performed, by alternately repeating, while the temperature of the wafer 200 is maintained at the second temperature: a step 1 of supplying an OMCTS gas to the wafer 200 and a step 2 of supplying an O$_2$ gas to the wafer 200, without supplying a hydrogen (H)-containing gas such as a H$_2$ gas. In the present disclosure, the film-forming sequence shown in FIG. 4 may be expressed as follows for the sake of convenience. The same notation is used for film-forming sequences in modifications to be described below.

$$H_2 \rightarrow (OMCTS \rightarrow O_2) \times n \Rightarrow SiO$$

In the case of performing the film-forming sequence shown in FIG. 4, a SiO film containing C may be formed on the wafer 200 depending on processing conditions. Hereinafter, an example in which a SiO film is formed on the wafer 200 will be described, but the present disclosure is not limited to this example.

When the term "wafer" is used in the present disclosure, it may refer to "a wafer itself" or "a wafer and a laminated body of predetermined layers or films formed on a surface of the wafer." When the phrase "a surface of a wafer" is used in the present disclosure, it may refer to "a surface of a wafer itself" or "a surface of a predetermined layer formed on a wafer. When the expression "a predetermined layer is formed on a wafer" is used in the present disclosure, it may mean that "a predetermined layer is directly formed on a surface of a wafer itself" or that "a predetermined layer is formed on a layer formed on a wafer." When the term "substrate" is used in the present disclosure, it may be synonymous with the term "wafer."

(Wafer Charging and Boat Loading)

A plurality of wafers 200 is charged on the boat 217 (wafer charging). Thereafter, as illustrated in FIG. 1, the boat 217 supporting the plurality of wafers 200 is lifted up by the boat elevator 115 to be loaded into the process chamber 201 (boat loading). In this state, the seal cap 219 seals the lower end of the reaction tube 203 via the O-ring 220. Before loading the boat, a $N_2$ gas is supplied from each of the gas supply pipes 232c and 232d into the process chamber 201 so that the interior of the process chamber 201 is purged with the $N_2$ gas and the $O_2$ gas is removed from the interior of the process chamber 201. However, as the surface of the wafers 200 is exposed to the atmosphere until the wafers 200 are loaded into the process chamber 201, the surface of the wafers 200 is in a state of being terminated by a hydroxy group (OH group), that is, OH-terminated. The supply of the $N_2$ gas into the process chamber 201 is continued from before the boat loading until boat unloading to be described below is completed.

(Pressure Adjustment and Temperature Adjustment)

The interior of the process chamber 201, that is, a space in which the wafers 200 exist, is vacuum-exhausted (depressurization-exhausted) by the vacuum pump 246 so as to reach a first pressure (treatment-starting pressure) to be described below. In this operation, the internal pressure of the process chamber 201 is measured by the pressure sensor 245. The APC valve 244 is feedback-controlled based on the measured pressure information. The wafers 200 in the process chamber 201 are heated by the heater 207 to the first pressure (treatment-starting pressure) to be described below. In this operation, the state of supplying electric power to the heater 207 is feedback-controlled based on the temperature information detected by the temperature sensor 263 such that the interior of the process chamber 201 has a desired temperature distribution. The rotation of the wafers 200 by the rotation mechanism 267 begins. The exhaust of the interior of the process chamber 201 and the heating and rotation of the wafers 200 may be continuously performed at least until the processing of the wafers 200 is completed.

(Step A)

When the internal pressure of the process chamber 201 reaches a first pressure and the temperature of the wafers 200 becomes stable at a first temperature, while maintaining the first pressure and the first temperature, a $H_2$ gas is supplied without supplying an $O_2$ gas, to the wafers 200.

Specifically, the valve 243b is opened to flow the $H_2$ gas into the gas supply pipe 232b. The flow rate of the $H_2$ gas is adjusted by the MFC 241b, and the $H_2$ gas is supplied into the process chamber 201 via the nozzle 249 b and is exhausted from the exhaust pipe 231. At this time, the thermally excited $H_2$ gas is supplied to the wafers 200. The $H_2$ gas is excited (activated) by heat when it passes through the nozzle 249b and the process chamber 201. The supply of the $H_2$ gas to the wafer 200 is continued at least until a step B to be described below is completed.

The first pressure is set to a pressure within a range of, e.g., 0.1 to 10 Torr (13.3 to 1,330 Pa). When the first pressure is lower than 13.3 Pa, a treatment effect to be described below by supplying the $H_2$ gas to the wafers 200 may not be obtained, and it may be difficult to suppress oxidation of the surface of the wafers 200. By setting the first pressure to a pressure of 13.3 Pa or higher, the treatment effect can be obtained, and it is possible to suppress oxidation of the surface of the wafers 200. If the first pressure exceeds 1,330 Pa and a small amount of oxygen component remains in the process chamber 201, the Hz gas supplied to the wafers 200 in the step A may react with the residual oxygen component in the process chamber 201, which may cause explosion in the process chamber 201. By setting the first pressure at a pressure of 1,330 Pa or lower, explosion in the process chamber 201 can be avoided and the film-forming process can be progressed safely.

The first temperature is set to a temperature within a range of, e.g., 200 to 500 degrees C., more specifically 300 to 400 degrees C. When the first temperature is lower than 200 degrees C., the treatment effect to be described below by supplying the $H_2$ gas to the wafers 200 may not be obtained. In this case, the $H_2$ gas is wastefully supplied, possibly resulting in an increase in gas cost. By setting the first temperature to a temperature of 200 degrees C. or higher, the treatment effect can be obtained and the above-mentioned problem can be solved. By setting the first temperature to a temperature of 300 degrees C. or higher, the treatment effect can be further enhanced and the above-mentioned problem can be more reliably avoided. If the first temperature exceeds 500 degrees C., OH groups existing on the surface of the wafers 200 react with each other to cause a dehydration condensation reaction in which water ($H_2O$) is generated on the surface of the wafers 200. The surface of the wafers 200 may be oxidized (i.e., a Si—O—Si bond may be generated on the surface of the wafers 200) by the action of $H_2O$ generated by this reaction. By setting the first temperature at a temperature of 500 degrees C. or lower, it is possible to suppress the above-mentioned dehydration condensation reaction and hence the oxidation of the surface of the wafers 200. By setting the first temperature to 400 degrees C. or lower, it is possible to more reliably suppress the dehydration condensation reaction and more reliably avoid the oxidation of the surface of the wafers 200.

In this manner, the first temperature is a temperature at which OH groups existing on the surface of the wafers 200 do not substantially react with each other and $H_2O$ is not substantially generated on the surface of the wafers 200. That is, the first temperature is a temperature at which the surface of the wafers 200 is not substantially oxidized due to the OH groups existing on the surface of the wafers 200.

The supply flow rate of the $H_2$ gas is set to a flow rate within a range of, e.g., 0.1 to 20 slm. If the supply flow rate of the $H_2$ gas is smaller than 0.1 slm, the treatment effect to be described below cannot be obtained and it may be difficult to suppress the oxidation of the surface of the wafers 200. By setting the supply flow rate of the $H_2$ gas to a flow rate of 0.1 slm or larger, the treatment effect can be obtained and the oxidation of the surface of the wafers 200 can be suppressed. If the supply flow rate of the $H_2$ gas exceeds 20 slm and a small amount of oxygen component remains in the process chamber 201, the $H_2$ gas reacts with the residual oxygen component in the process chamber 201, which may cause explosion in the process chamber 201. By setting the supply flow rate of the $H_2$ gas to a flow rate of 20 slm or smaller, explosion in the process chamber 201 can be avoided and the film-forming process can be progressed safely.

The supply time of the $H_2$ gas is set to a time within a range of, e.g., 10 seconds to 300 minutes. If the supply time of the $H_2$ gas is shorter than 10 seconds, the treatment effect to be described below may not spread over the entire surface of the wafers 200. By setting the supply time of the $H_2$ gas to 10 seconds or longer, the treatment effect can be obtained over the entire surface of the wafers 200, and oxidation can be suppressed over the entire surface of the wafers 200. If the supply time of the $H_2$ gas exceeds 300 minutes, the treatment effect may be saturated and the $H_2$ gas may be wastefully supplied, possibly resulting in a decrease in productivity and an increase in gas cost. By setting the supply time of the $H_2$ gas to a time within 300 minutes, it is possible to avoid this problem.

By supplying the thermally excited $H_2$ gas to the wafers 200 under the above-mentioned conditions, it is possible to remove the OH groups from the surface of the wafers 200 by substituting OH termination on the surface of the wafers 200 with H termination. This constitutes a part of the treatment effect to be described below, the details of which will be described below.

(Step B)

After performing the step A to make the entire surface of the wafers 200 H-terminated, in a state where the $H_2$ gas is supplied without supplying an $O_2$ gas to the wafers 200, the output of the heater 207 is adjusted to change the temperature of the wafers 200 from the first temperature to a second temperature (deposition temperature) higher than the first temperature.

The second temperature is set to a temperature within a range of, e.g., 600 to 1,000 degrees C., specifically 700 to 900 degrees C., more specifically 800 to 900 degrees C. When the second temperature is lower than 600 degrees C., it is difficult for OMCTS to be chemically adsorbed on the wafers 200 in a step C to be described below, so that a practical deposition rate cannot be obtained. By setting the deposition temperature to a temperature of 600 degrees C. or higher, it is possible to solve this problem. By setting the deposition temperature to a temperature of 700 degrees C. or higher, it is possible to more sufficiently adsorb OMCTS on the wafers 200 in the step C, so that a more sufficient deposition rate can be obtained. By setting the deposition temperature to a temperature of 800 degrees C. or higher, this effect can be further enhanced.

If the second temperature exceeds 1,000 degrees C., an excessive vapor phase reaction occurs in the step C to be described below. This reaction may deteriorate the film thickness uniformity between the wafers 200 or in the plane of the wafers 200 (hereinafter simply referred to as film thickness uniformity), making it difficult to control the film thickness uniformity. By setting the second temperature to a temperature of 1,000 degrees C. or lower, a proper vapor phase reaction occurs in the step C, which can prevent deterioration of the film thickness uniformity, making it possible to control the film thickness uniformity. By setting the second temperature to a temperature of 900 degrees C. or lower, a surface reaction can be made dominant over the gas phase reaction in the step C, which easily ensures the film thickness uniformity, making it easy to control the film thickness uniformity.

When the temperature of the wafers 200 is changed to such a temperature, that is, a temperature exceeding 500 degrees C., $H_2O$ is generated by the dehydration condensation reaction between OH groups existing on the surface of the wafers 200, and the surface of the wafers 200 is oxidized, as mentioned above.

Therefore, in the present embodiments, this problem is avoided by performing the above-described step A before performing the step B. This is because, as in the present embodiments, before performing the step B, by supplying the $H_2$ gas without supplying the $O_2$ gas to the wafers 200 at the first temperature, it is possible to substitute the OH termination with the H termination before the OH groups existing on the surface of the wafers 200 react with each other. This makes it possible to avoid the dehydration condensation reaction on the surface of the wafers 200 during the progress of the step B and to suppress the oxidation of the surface of the wafers 200.

Further, in the present embodiments, since the thermally excited $H_2$ gas is supplied without supplying the $O_2$ gas to the wafers 200 at the time of performing the step B, the oxidation of the surface of the wafers 200 can be more reliably avoided. This is because, even if a small amount of OH groups remains on the surface of the wafers 200 at the end of the step A, the $H_2$ gas is supplied without supplying the $O_2$ gas to the wafers 200 when performing the step B, to thereby substitute the OH termination slightly remaining on the surface of the wafers 200 with the H termination. This makes it possible to more reliably avoid the progress of the dehydration condensation reaction on the surface of the wafers 200 during the progress of the step B and more reliably avoid the oxidation of the surface of the wafers 200. Further, when performing the step B, since the $H_2$ gas is supplied without supplying the $O_2$ gas to the wafers 200, in a case where a small amount of oxygen component remains in the process chamber 201 or the like, it is possible to prevent the residual oxygen component from oxidizing the surface of the wafers 200.

As a result, in the present embodiments, it is possible to greatly reduce the amount of oxidation on the surface of the wafers 200. Further, in the present embodiments, in each of the steps A and B, by supplying the $H_2$ gas without supplying the $O_2$ gas to the wafers 200, it is also possible to significantly reduce the interface trap density between the wafers 200 and the SiO films formed on the wafers 200. This effect obtained by performing the steps A and B is referred to as a "$H_2$ treatment effect" or "treatment effect" in the present disclosure.

(Temperature Stabilization and Pre-Purging)

When the temperature of the wafers 200 reaches the second temperature, it waits for a predetermined time while maintaining the supply of the $H_2$ gas to the wafer 200 at least until the temperature of the wafers 200 is stabilized (temperature stabilization). While waiting, by continuing the supply of the $H_2$ gas without stopping it, when a small amount of oxygen component remains in the process chamber 201 or the like, it is possible to avoid this residual oxygen component from reacting with the surface of the wafers. The temperature of the wafers 200 is maintained at the second temperature at least until the step C to be described below is completed.

When the temperature of the wafers 200 reaches the second temperature and becomes stable, the valve 243b is closed to stop the supply of the $H_2$ gas into the process chamber 201. At this time, the interior of the process chamber 201 is exhausted by the vacuum pump 246 while keeping the APC valve 244 open. At this time, the valves 243c and 243d are kept open, and a N$_2$ gas as a purge gas is supplied into the process chamber 201. Thus, the interior of the process chamber 201 is purged with the inert gas, and the H$_2$ gas remaining in the process chamber 201 is removed from the process chamber 201 (pre-purging). By performing the pre-purging before the start of the step C, explosion by the H$_2$ gas remaining in the process chamber 201 can be avoided in the step C.

(Step C)

When the temperature of the wafers 200 is stabilized at the second temperature and the pre-purging in the process chamber 201 is completed, the following steps 1 and 2 are performed.

[Step 1]

In this step, an OMCTS gas is supplied to the wafers 200 in the process chamber 201.

Specifically, the valve 243a is opened to flow the OMCTS gas into the gas supply pipe 232a. The flow rate of the OMCTS gas is adjusted by the MFC 241a, and the OMCTS gas is supplied into the process chamber 201 via the nozzle 249a and is exhausted from the exhaust pipe 231. At this time, the OMCTS gas is supplied to the wafer 200. At this time, with the valves 243c and 243d kept open, the supply of the N$_2$ gas into the process chamber 201 via the nozzles 249a and 249b is maintained. The N$_2$ gas supplied from the nozzle 249a acts as a carrier gas that promotes diffusion of the OMCTS gas into the process chamber 201. The N$_2$ gas supplied from the nozzle 249b also acts as an intrusion-inhibiting gas for inhibiting intrusion of the OMCTS gas into the nozzle 249b.

At this time, the supply flow rate of the OMCTS gas is set to a flow rate in a range of, e.g., 1 to 2,000 sccm, specifically 10 to 1,000 sccm. The supply flow rate of the N$_2$ gas supplied from each gas supply pipe is set to a flow rate within a range of, e.g., 100 to 10,000 sccm. The supply time of the OMCTS gas is set to a time within a range of, e.g., 1 to 120 seconds, specifically 1 to 60 seconds. The internal pressure of the process chamber 201 (the pressure at the time of supplying the precursor) is set to a pressure within a range of, e.g., 0.1 to 10 Torr (13.3 to 1,330 Pa). The temperature of the wafers 200 is maintained at the aforementioned second temperature.

By supplying the OMCTS gas to the wafers 200 under the above-described conditions, a first layer (initial layer), for example, a layer containing Si and O (SiO-containing layer) having a thickness of from less than 1 atomic layer to several atomic layers (from less than 1 molecular layer to several molecular layers), is formed on the outermost of the wafers 200. The SiO-containing layer may be a SiO layer, an OMCTS adsorption layer, or both. The SiO-containing layer may also be a layer containing a Si—O bond or a Si—O—Si bond and may further contain C (including a Si—C bond).

The SiO-containing layer is a generic term including a continuous layer containing Si and O, a discontinuous layer, and a SiO thin film formed by overlapping these layers. The Si constituting the SiO-containing layer includes not only those in which a bond with O or C is not completely broken but also those in which the bond with O or C is completely broken.

The OMCTS adsorption layer includes a continuous adsorption layer composed of OMCTS molecules, and a discontinuous adsorption layer. The OMCTS molecules constituting the OMCTS adsorption layer also include those in which Si and O are bonded to each other and the bond between Si and C is partially broken. That is, the OMCTS adsorption layer may be a physical adsorption layer of OMCTS, a chemisorption layer of OMCTS, or both.

Herein, a layer having a thickness of less than one atomic layer (molecular layer) means an atomic layer (molecular layer) which is discontinuously formed, and a layer having a thickness of one atomic layer (molecular layer) means an atomic layer (molecular layer) which is continuously formed. The SiO-containing layer may include both a SiO layer and an OMCTS adsorption layer. However, for the sake of convenience, the SiO-containing layer may be expressed using expressions such as a "one atomic layer," a "several-atomic layer" and the like, and "atomic layer" may be used synonymously with "molecular layer."

Under the condition that the OMCTS gas is self-decomposed (pyrolyzed), Si and O are deposited on the wafers 200 to form a SiO layer. Under the condition that the OMCTS gas is not self-decomposed (pyrolyzed), the OMCTS adsorption layer is formed by adsorption of OMCTS on the wafers 200. It is possible to increase the deposition rate by forming a SiO layer on the wafers 200 rather than forming an OMCTS adsorption layer on the wafers 200.

If the thickness of the first layer exceeds a several-atomic layer, the action of modifying in the step 2 to be described below does not reach the entire first layer. In addition, the minimum value of the thickness of the first layer is less than one atomic layer. Therefore, it is preferable that the thickness of the first layer is from less than one atomic layer to a several-atomic layer. By setting the thickness of the first layer to one atomic layer or less, that is, to one atomic layer or less than one atomic layer, the action of modifying in the step 2 to be described below can be relatively enhanced, and the time required for modification in the step 2 can be shortened. It is also possible to shorten the time required for forming the first layer in the step 1. As a result, the processing time per cycle can be shortened, and the total processing time can be shortened accordingly. That is, it is also possible to increase the deposition rate. Further, by making the thickness of the first layer equal to or less than one atomic layer, it is possible to enhance the controllability of film thickness uniformity.

After the first layer is formed, the valve 243a is closed to stop the supply of the OMCTS gas. At this time, with the APC valve 244 kept open, the interior of the process chamber 201 is exhausted by the vacuum pump 246 to exclude an unreacted OMCTS gas remaining in the process chamber 201 or an OMCTS gas contributed to the formation of the first layer from the process chamber 201. At this time, with the valves 243c and 243d kept open, the supply of the N$_2$ gas into the process chamber 201 is maintained. The N$_2$ gas acts as a purge gas.

As the precursor gas, in addition to the OMCTS gas, it may be possible to use, e.g., a siloxane-based precursor gas including an alkyl group, such as an HMDSO gas, a TMDSO gas or the like, or a siloxane-based precursor gas including a halogen group, such as an OCCTS gas, an HCDSO gas, a TCDSO gas or the like. Further, as the precursor gas, in addition to the siloxane-based precursor gas, it may be possible to use, e.g., a silazane-based precursor gas including an alkyl group, such as an OMCTSN gas, an HMDSN gas, a TMDSN gas or the like, or a silazane-based precursor gas including a halogen group, such as an OCCTSN gas, an HCDSN gas, a TCDSN gas or the like. In this manner, at least one selected from the group consisting of a siloxane compound and a silazane compound can be used as the precursor gas.

The siloxane compound and the silazane compound tend to have a higher pyrolysis temperature (i.e., less likely to be self-decompressed) than that of a silicon hydride compound such as a disilane ($Si_2H_6$, abbreviation: DS) gas, a halosilane compound such as a hexachlorodisilane ($Si_2Cl_6$, abbreviation: HCDS) gas, or an aminosilane compound such as a trisdimethylaminosilane ($Si[N(CH_3)_2]_3H$, abbreviation: 3DMAS) gas. This is because siloxane bonds and silazane bonds of these compounds are relatively stable. Therefore, when the deposition temperature (second temperature) is set to the high temperature side as in the present embodiments, by using these compounds having the high pyrolysis temperature as the precursor gas, it is possible to suppress excessive pyrolysis of the precursor gas in the process chamber 201, thereby enhancing the controllability of the film-forming process. Further, it is also possible to increase the film thickness uniformity of films formed on the wafers 200.

In addition, when the siloxane compound or the silazane compound having the high pyrolysis temperature is used as the precursor gas, there is a high possibility that Si is deposited on the wafers 200 while maintaining the siloxane bonds and the silazane bonds. In this case, migration of Si deposited on the wafers 200 is suppressed, and Si aggregation is less likely to occur on the surface of the wafers 200. This makes it possible to improve the surface roughness of the film formed on the wafers 200. The surface roughness means a difference in height of the film in the wafer surface. A smaller surface roughness indicates a smoother surface. That is, the improvement of the surface roughness means that the height difference of the film is reduced and the smoothness of the surface is improved.

The siloxane compound tends to have a higher pyrolysis temperature than the silazane compound. Therefore, when the siloxane compound is used as the precursor gas, the above-mentioned various effects tend to be obtained with higher reliability than the case of using the silazane compound as the precursor gas.

In addition, when comparing the pyrolysis temperatures of siloxane compounds such as the OMCTS gas, the HMDSO gas and the TMDSO gas, among them, the pyrolysis temperature of the OMCTS gas having a cyclic structure tends to be relatively high, whereas the pyrolysis temperature of the TMDSO gas or the like having a chain structure tends to be relatively low. Therefore, the controllability of the film-forming process and the film thickness uniformity tend to be relatively high when the OMCTS gas is used as the precursor gas, but relatively low when the TMDSO gas or the like is used as the precursor gas. In addition, when comparing the molecular weights of the OMCTS gas, the HMDSO gas and the TMDSO gas, the molecular weight of the OMCTS gas having a cyclic structure tends to be relatively high, whereas the molecular weight of the TMDSO gas or the like having a chain structure tends to be relatively small. Therefore, the thickness (cycle rate) of the first layer formed per cycle, that is, a deposition rate, tends to be relatively high when the OMCTS gas is used as the precursor gas, but relatively low when the TMDSO gas or the like is used as the precursor gas.

These points have the same tendency when comparing the silazane compounds such as the OMCTSN gas, the HMDSN gas and the TMDSN gas. That is, the controllability of the film-forming process, the film thickness uniformity and the deposition rate tend to be relatively high when the OMCTSN gas having a cyclic structure is used as the precursor gas, but relatively low when the TMDSN gas or the like having a chain structure is used as the precursor gas.

As the inert gas, in addition to the $N_2$ gas, it may be possible to use, e.g., a rare gas such as an Ar gas, a He gas, a Ne gas, a Xe gas or the like.

[Step 2]

After the step 1 is completed, an $O_2$ gas is supplied to the wafers 200 in the process chamber 201 without supplying an H-containing gas such as a $H_2$ gas.

In this step, the valve 243b is opened to flow the $O_2$ gas into the gas supply pipe 232b. The flow rate of the $O_2$ gas is adjusted by the MFC 241b, and the $O_2$ gas is supplied into the process chamber 201 via the nozzle 249b and is exhausted from the exhaust pipe 231. At this time, the thermally excited $O_2$ gas is supplied to the wafers 200. The $O_2$ gas is thermally excited when passing through the nozzle 249b and when flowing through the process chamber 201. The points that the valves 243c and 243d are kept open and the supply of the $N_2$ gas into the process chamber 201 via the nozzles 249a and 249b is maintained are the same as in the step 1.

At this time, the supply flow rate of the $O_2$ gas is set to a flow rate within a range of, e.g., 100 to 10,000 sccm. The supply time of the Oz gas is set to a time within a range of, e.g., 1 to 120 seconds, specifically 1 to 60 seconds. The internal pressure (oxidation pressure) of the process chamber 201 is set to a pressure within a range of, e.g., 0.1 to 20 Torr (13.3 to 2,660 Pa). When the oxidation pressure is lower than 13.3 Pa, the oxidizing power of the $O_2$ gas becomes insufficient, so that the oxidation of the first layer formed on the wafer 200 becomes insufficient or it takes a time for the oxidation, which may result in decrease in productivity. By setting the oxidation pressure at a pressure of 13.3 Pa or higher, it is possible to increase the oxidizing power of the $O_2$ gas to solve the above-mentioned problem. If the oxidation pressure exceeds 2,660 Pa, the oxidizing power of the $O_2$ gas becomes excessive, which may increase the oxidation amount of the surface of the wafers 200 which are the base of film formation. By setting the oxidation pressure at a pressure of 2,660 Pa or lower, it is possible to optimize the oxidizing power of the $O_2$ gas to suppress the oxidation of the surface of the wafers 200. Other processing conditions are the same as the processing conditions in the step 1.

By supplying the thermally excited $O_2$ gas to the wafers 200 under the above-mentioned conditions, at least a part of the first layer formed on the wafers 200 in the step 1 can be modified (oxidized). That is, at least a part of the O component contained in the $O_2$ gas can be added to the first layer to further form a Si—O bond in the first layer. At this time, it is also possible to break a Si—C bond contained in the first layer and desorb C from the first layer. As the first layer is oxidized, a SiO layer containing Si and O is formed as a second layer on the wafers 200. The second layer has a higher O concentration and a lower C concentration than the first layer. According to this oxidation treatment, the oxidizing power can be appropriately weakened as compared with cases where an $O+H_2$ gas obtained by adding a $H_2$ gas to an Oz gas is used as an oxidizing agent, an ozone ($O_3$) gas is used as an oxidizing agent and a plasma-excited $O_2$ ($O_2$*) gas is used as an oxidizing agent. This makes it possible to suppress the oxidation of the surface of the wafers 200 which are the base when oxidizing the first layer.

After changing the first layer to the second layer, the valve 243b is closed to stop the supply of the $O_2$ gas. Then, according to the same processing procedure as in the step 1, an unreacted Oz gas remaining in the process chamber 201 or an $O_2$ gas contributed to the oxidation and reaction by-products are excluded from the process chamber 201.

As the O-containing gas (oxidizing agent), in addition to the $O_2$ gas, it may be possible to use, e.g., a nitrogen oxide gas such as a nitrogen monoxide (NO) gas, a nitrous oxide ($N_2O$) gas or a nitrogen dioxide ($NO_2$) gas. Since these thermally excited nitrogen oxide gases have a weaker oxidizing power than the thermally excited $O_2$ gas, when these gases are used as an oxidizing agent, the oxidation of the surface of the wafers 200 which are the base can be more reliably suppressed.

As the inert gas, in addition to the $N_2$ gas, it may be possible to use, e.g., the various rare gases exemplified in the step 1.

(Performing Predetermined Number of Times)

By alternately repeating the above-described steps 1 and 2 a predetermined number of times (n times), a SiO film having a predetermined film thickness can be formed on the wafers 200. This cycle may be repeated multiple times. That is, the thickness of the second layer formed per one cycle may be set to be smaller than a desired film thickness. Thus, the above cycle may be repeated multiple times until the film thickness of a SiO film formed by laminating the second layer becomes equal to the desired film thickness.

(After-Purging to Atmospheric Pressure Returning)

When the formation of the SiO film is completed, with the APC valve 244 kept open, the interior of the process chamber 201 is exhausted by the vacuum pump 246, and the processing gas remaining in the process chamber 201 is excluded from the interior of the process chamber 201. At this time, with the valves 243c and 243d kept open, a $N_2$ gas as a purge gas is supplied into the process chamber 201. Thus, the interior of the process chamber 201 is purged with the inert gas, so that the gas remaining in the process chamber 201 and reaction by-products are removed from the interior of the process chamber 201 (after-purging). Thereafter, the temperature of the wafers 200 in the process chamber 201 is decreased to a predetermined third temperature (unloading temperature) (temperature decreasing), the internal atmosphere of the process chamber 201 is replaced with an inert gas (inert gas replacement), and the internal pressure of the process chamber 201 returns to the normal pressure (returning to the atmospheric pressure).

(Boat Unloading and Wafer Discharging)

The seal cap 219 is lowered by the boat elevator 115, and the lower end of the reaction tube 203 is opened. Then, in a state where the processed wafers 200 are supported by the boat 217, the wafers 200 are unloaded from the lower end of the reaction tube 203 to the outside of the reaction tube 203 (boat unloading). The processed wafers 200 are discharged from the boat 217 (wafer discharging).

(3) Effects of the Present Embodiments

According to the present embodiments, one or more effects set forth below may be achieved.

(a) By performing the step A before performing the step B, it is possible to substitute the OH termination on the surface of the wafers 200 with the H termination. This makes it possible to avoid the dehydration condensation reaction on the surface of the wafers 200 to suppress the oxidation of the surface of the wafers 200 which are the base of film formation.

(b) In the step B, the thermally excited Hz gas is supplied without supplying the $O_2$ gas to the wafers 200. Therefore, when a small amount of OH termination remains on the surface of the wafers 200, it is possible to substitute the OH termination with the H termination. This makes it possible to more reliably avoid the progress of the dehydrating condensation reaction on the surface of the wafers 200 during the progress of the step B and to further suppress the oxidation of the surface of the wafers 200. In addition, when a small amount of oxygen component remains in the process chamber 201 or the like, it is also possible to avoid the residual oxygen component from reacting with the surface of the wafers 200.

(c) Since the OMCTS gas having a high pyrolysis temperature is used as the precursor gas, even when the deposition temperature (second temperature) is set to the high temperature side as in these embodiments, it is possible to enhance the controllability of the film-forming process and the film thickness uniformity of the SiO film formed on the wafers 200. In addition, since the OMCTS gas having a large molecular weight is used as the precursor gas, it is also possible to improve the deposition rate.

(d) Since the thermally excited $O_2$ gas, that is, an oxidizing agent having an appropriate oxidizing power, is used as the O-containing gas, even when the deposition temperature (second temperature) in the step C is set to the high temperature side, it is possible to suppress the oxidation of the surface of the wafers 200 which are the base.

(e) By performing the steps A and B and setting the deposition temperature (second temperature) in the step C to the high temperature as described above, the SiO film formed on the wafers 200 can be an insulating film having a low interface trap density. Further, by setting the deposition temperature in the step C to be high, the SiO film formed on the wafers 200 can be an insulating film having a low impurity concentration, excellent electrical insulation performance (leak tolerance and electrical characteristics), and high reliability of useful life.

(f) By maintaining the temperature of the wafers 200 at the second temperature at least until the step C is ended after the temperature of the wafers 200 reaches the second temperature, it is easier to maintain the surface state of the wafers 200, on which the $H_2$ treatment has been performed, than a case where the temperature of the wafers 200 is decreased to a temperature lower than the second temperature, reliably obtaining the above-described effects. Further, since the temperature of the wafers 200 is not changed, it is possible to shorten the time required for the film-forming process, thereby improving the productivity.

(g) In the step C, by alternately performing the supply of the OMCTS gas and the supply of the $O_2$ gas with the purging in the process chamber 201 interposed therebetween, these gases can appropriately react with each other under the condition where the surface reaction is dominant, thereby improving the controllability of the film thickness. Further, it is possible to suppress generation of particles in the process chamber 201, thereby improving the quality of the film-forming process.

(h) The above-described effects can also be obtained in the same manner when a siloxane-based precursor gas or a silazane-based precursor gas other than the OMCTS gas is used as the precursor gas. Further, the above-described effects can also be obtained in the same manner when an oxidizing agent other than the $O_2$ gas is used as the O-containing gas and when a deuterium ($D_2$) gas is used instead of the $H_2$ gas.

(4) Modifications

The film-forming process in these embodiments can be changed as in the following modifications. These modifications can be used in proper combination.

(Modification 1)

In the film-forming sequence shown in FIG. 4, an example in which the thermally excited H$_2$ gas is supplied to the wafers 200 in each of the steps A and B has been described. However, the present embodiments are not limited thereto. For example, in at least one selected from these steps, a plasma-excited H$_2$ (H$_2$*) gas may be supplied to the wafers 200 instead of the thermally excited H$_2$ gas. Since the H$_2$* gas has higher energy than the thermally excited H$_2$ gas, by doing this, the above-described treatment effect can be more reliably obtained, and the oxidation of the surface of the wafers 200 can be more reliably avoided.

(Modification 2)

In the film-forming sequence shown in FIG. 4, an example in which the supply of the H$_2$ gas to the wafers 200 is started before the start of the step B, that is, before a timing at which the temperature of the wafers 200 is further raised from the first temperature, has been described. However, the present embodiments are not limited thereto. For example, the supply of the H$_2$ gas to the wafers 200 may be started simultaneously with or after the above-mentioned timing. Alternatively, the supply of the H$_2$ gas to the wafers 200 may be started immediately after the temperature of the wafers 200 reaches the first temperature without waiting for its stabilization.

(Modification 3)

In the film-forming sequence shown in FIG. 4, an example in which the supply of the H$_2$ gas is continued for a predetermined time even after the temperature of the wafers 200 reaches the second temperature has been described. However, the present embodiments are not limited thereto. For example, the supply of the H$_2$ gas to the wafers 200 may be stopped at the same time when the temperature of the wafers 200 reaches the second temperature. Further, for example, the supply of the H$_2$ gas to the wafers 200 may be stopped before the temperature of the wafers 200 reaches the second temperature.

(Modification 4)

As the reactant, for example, a C-containing gas (hydrocarbon gas) such as a propylene (C$_3$H$_6$) gas, a N-containing gas (nitriding agent, hydrogen nitride gas) such as an ammonia (NH$_3$) gas, or a C and N-containing gas (amine-based gas) such as a triethylamine ((C$_2$H$_5$)$_3$N, abbreviation: TEA) gas may be used to form a silicon oxynitride film (SiON film), a silicon oxycarbonitride film (SiOCN film) or a silicon oxycarbide film (SiOC film) on the wafers 200 according to the following film-forming sequences.

H$_2$→(OMCTS→NH$_3$→O$_2$)×n⇒SiON

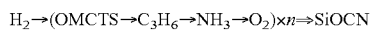

H$_2$→(OMCTS→C$_3$H$_6$→NH$_3$→O$_2$)×n⇒SiOCN

H$_2$→(OMCTS→TEA→O$_2$)×n⇒SiOC(N)

OTHER EMBODIMENTS

While some embodiments of the present disclosure have been specifically described above, the present disclosure is not limited to the aforementioned embodiments but may be differently modified without departing from the subject matter of the present disclosure.

The present disclosure can be also suitably applied to a case of forming an oxide film containing a semimetal element such as germanium (Ge), boron (B) or the like as a main element in addition to Si on a substrate. The present disclosure can be also suitably applied to a case of forming an oxide film (metal oxide) containing a metal element such as titanium (Ti), zirconium (Zr), hafnium (Hf), tantalum (Ta), niobium (Nb), molybdenum (Mo), tungsten (W), yttrium (Y), strontium (Sr), lanthanum (La), ruthenium (Ru), aluminum (Al) or the like as a main element on a substrate.

Recipes used in substrate processing may be prepared individually according to the processing contents and may be stored in the memory device 121c via a telecommunication line or the external memory device 123. Moreover, at the start of the substrate processing, the CPU 121a may properly select an appropriate recipe from the recipes stored in the memory device 121c according to the processing contents. Thus, it is possible for a single substrate processing apparatus to form films of different kinds, composition ratios, qualities and thicknesses with enhanced reproducibility. In addition, it is possible to reduce an operator's burden and to quickly start the substrate processing while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the substrate processing apparatus.

The example in which films are formed using a batch-type substrate processing apparatus capable of processing a plurality of substrates at a time has been described in the above embodiments. The present disclosure is not limited to the above embodiments but may be appropriately applied to, e.g., a case where films are formed using a single-wafer-type substrate processing apparatus capable of processing a single substrate or several substrates at a time. In addition, the example in which films are formed using a substrate processing apparatus provided with a hot-wall-type process furnace has been described in the above embodiments. The present disclosure is not limited to the above embodiments but may be appropriately applied to a case where films are formed using a substrate processing apparatus provided with a cold-wall-type process furnace.

Even in the case of using these substrate processing apparatuses, film formation can be performed under the same processing procedures and processing conditions as in the above-described embodiments and modifications and the same effects as those of the above embodiments and modifications can be obtained.

In addition, the embodiments and modifications described above can be used in appropriate combination. The processing procedures and processing conditions at this time can be the same as the processing procedures and processing conditions of the above-described embodiments and modifications.

Figure 8A:
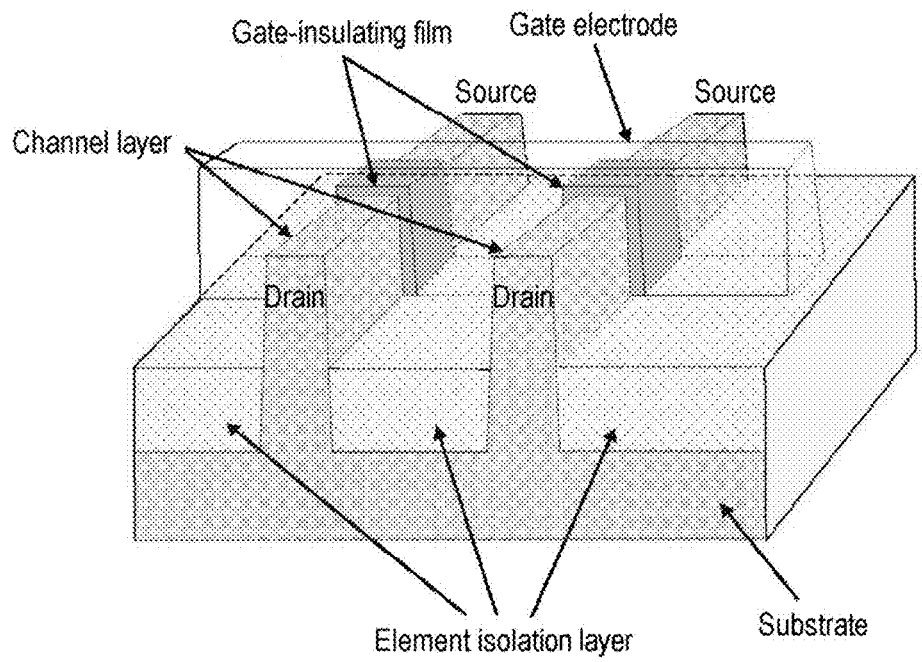
FIGS. 8A and 8B are a partially-enlarged view of a transistor including a SiO film as a gate-insulating film and an enlarged sectional view of a transistor including a SiO film as a gate-insulating film, respectively.
Figure 8B:
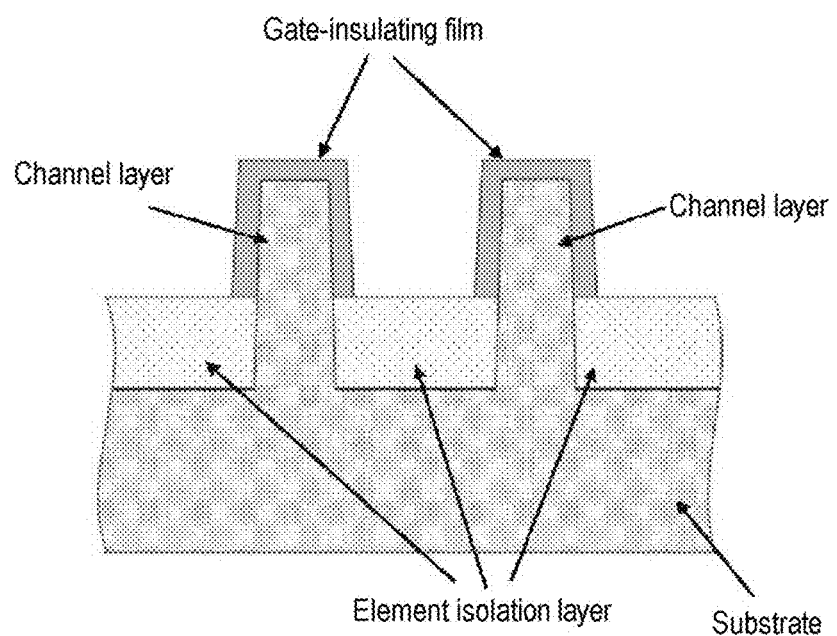

The methods of the above-described embodiments and modifications can be suitably applied, for example, when forming a gate-insulating film included in a FinFET shown in FIGS. 8A and 8B. As shown in these figures, the FinFET includes a substrate configured as a Si wafer, a channel layer formed on the substrate by Si or the like, and a gate electrode formed by titanium nitride (TiN) or the like on the channel layer. The channel layer connects a source side electrode and a drain side electrode in the transistor element. A gate-insulating film made of SiO that electrically isolates the channel layer and the gate electrode from each other is formed between the channel layer and the gate electrode. Adjacent channel layers are separated from each other by an element isolation layer made of SiO or the like. The gate electrode is not shown in FIG. 8B. When forming the gate-insulating film of the FinFET shown in these figures, the same effects as those of the above-described embodiments and modifications can be obtained by applying the methods of the above-described embodiments and modifications. The present disclosure is very effective for enhancing the performance and yield of a device such as a FinFET which has advanced in 3D and miniaturization.

EXAMPLES

Hereinafter, experimental results that support the effects obtained in the above-described embodiments and modifications will be described.

As Sample 1, a SiO film was formed on a wafer by using the substrate processing apparatus shown in FIG. 1 according to the film-forming sequence shown in FIG. 4. The processing conditions in each step were predetermined conditions within the processing condition range described in the above embodiments.

As Sample 2, a SiO film was formed on a wafer by using the substrate processing apparatus shown in FIG. 1 according to a film-forming sequence in which the step A in the film-forming sequence shown in FIG. 4 was not performed and a $H_2$ gas was not supplied in the step B. The processing conditions were the same as the processing conditions at the time of preparation of Sample 1.

As Sample 3, a SiO film was formed on a wafer by using the substrate processing apparatus shown in FIG. 1 according to a film-forming sequence in which the step A in the film-forming sequence shown in FIG. 4 was not performed, a $H_2$ gas was not supplied in the step B, and a thermally excited $O_2+H_2$ gas instead of a thermally excited $O_2$ gas was used as an oxidizing agent in the step C. The processing conditions were the same as the processing conditions at the time of preparation of Sample 1.

The film-forming sequences (gas-supplying sequences) at the time of preparation of Samples 1 to 3 are as follows.

$H_2 \rightarrow (OMCTS \rightarrow O_2) \times n \Rightarrow SiO$      Sample 1

$N_2 \rightarrow (OMCTS \rightarrow O_2) \times n \Rightarrow SiO$      Sample 2

$N_2 \rightarrow (OMCTS \rightarrow O_2 \rightarrow H_2) \times n \Rightarrow SiO$      Sample 3

Figure 7:
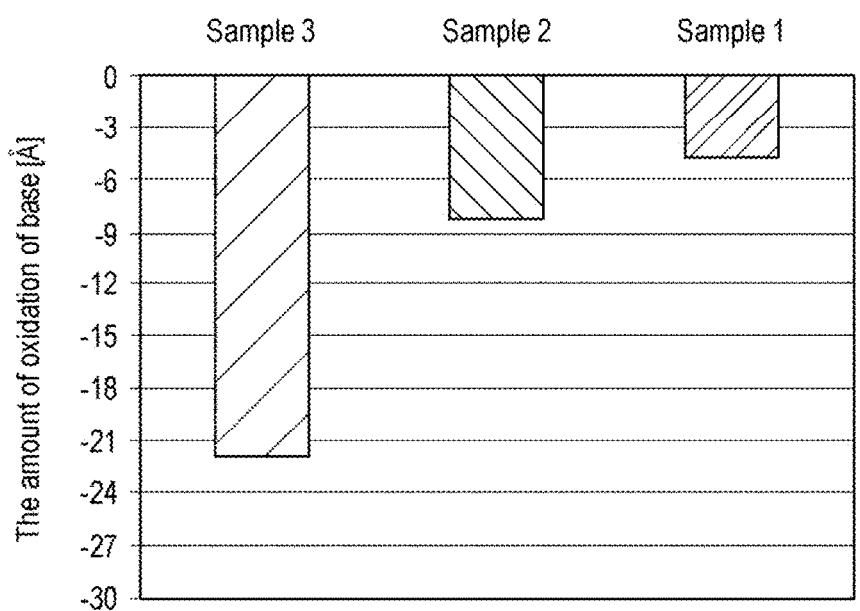
FIG. 7 is a view showing the results of evaluation on oxidation amount of the base.

For each of Samples 1 to 3, the oxidation amount of the base, on which the step C has been performed, that is, the oxidation amount of the surface of the wafer, was measured. FIG. 7 is a view showing the results of the measurement. In FIG. 7, the vertical axis represents the oxidation amount (depth of an oxidized region) [Å] of the base and the horizontal axis represents each sample.

As can be seen from FIG. 7, the oxidation amount of the base is smaller in the order of Samples 1, 2 and 3 (the oxidation amount of Sample 1 is the smallest). The reason why the oxidation amount of the base in Sample 1 is smaller than that of Sample 2 is that, in Sample 1, the step A for supplying the $H_2$ gas to the wafer is performed before the step B, whereas, in Sample 2, these operations are not performed. The reason why the oxidation amount of the base in Sample 2 is smaller than that of Sample 3 is that, in Sample 2, the $O_2$ gas is used as an oxidizing agent in the step C, whereas, in Sample 3, the $O_2+H_2$ gas with a strong oxidizing power is used as an oxidizing agent in the step C.

As can be understood from these facts, in Sample 1, it is possible to greatly suppress both the oxidation of the base at the time of temperature rise in the step B and the oxidation of the base at the time of film formation in the step C, thereby significantly reducing the oxidation amount of the base.

According to the present disclosure in some embodiments, it is possible to suppress oxidation of a substrate as a base when an oxide film is formed on the substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:
    (a) supplying a hydrogen gas to a substrate set to a first temperature, without supplying any oxygen-containing gas;
    (b) changing a temperature of the substrate from the first temperature to a second temperature, which is higher than the first temperature, while the hydrogen gas is supplied to the substrate, without supplying any oxygen-containing gas; and
    (c) forming an oxide film on the substrate, on which (a) and (b) have been performed, by alternately repeating, while the temperature of the substrate is maintained at the second temperature:
    supplying a precursor gas to the substrate; and
    supplying an oxygen-containing gas to the substrate, without supplying any hydrogen-containing gas.

2. The method according to claim 1, wherein the first temperature is a temperature at which hydroxy groups existing on a surface of the substrate do not substantially react with each other.

3. The method according to claim 1, wherein the first temperature is a temperature at which $H_2O$ is not substantially generated by reaction between hydroxy groups existing on a surface of the substrate.

4. The method according to claim 1, wherein the first temperature is a temperature at which a surface of the substrate is not substantially oxidized due to hydroxy groups existing on the surface of the substrate.

5. The method according to claim 1, wherein the first temperature is 200 degrees C. or higher and 500 degrees C. or lower.

6. The method according to claim 1, wherein in (a) and (b), hydroxy termination on a surface of the substrate is substituted with hydrogen termination.

7. The method according to claim 1, wherein in (a) and (b), hydroxy termination on a surface of the substrate is substituted with hydrogen termination before hydroxy groups existing on the surface of the substrate react with each other.

8. The method according to claim 1, wherein in (a) and (b), the hydrogen gas, which is thermally excited or plasma-excited, is supplied to the substrate.

9. The method according to claim 1, wherein the oxygen-containing gas includes an oxygen gas or a nitrogen oxide gas.

10. The method according to claim 1, wherein the precursor gas includes a siloxane compound or a silazane compound.

11. The method according to claim 1, wherein the precursor gas includes a siloxane compound having a cyclic structure or a silazane compound having a cyclic structure.

12. The method according to claim 1, wherein the second temperature is 600 degrees C. or higher and 1,000 degrees C. or lower.

13. The method according to claim 1, wherein the temperature of the substrate is maintained at the second temperature at least until (c) is completed after the temperature of the substrate reaches the second temperature in (b).

14. A substrate processing apparatus comprising:
   a process chamber in which a substrate is processed;
   a hydrogen gas supply system configured to supply a hydrogen gas into the process chamber;
   a precursor gas supply system configured to supply a precursor gas into the process chamber;
   an oxygen-containing gas supply system configured to supply an oxygen-containing gas into the process chamber;
   a heater configured to heat the substrate in the process chamber; and
   a controller configured to control the hydrogen gas supply system, the precursor gas supply system, the oxygen-containing gas supply system, and the heater so as to perform a process, in the process chamber, including:
   (a) supplying the hydrogen gas to the substrate set to a first temperature, without supplying any oxygen-containing gas;
   (b) changing a temperature of the substrate from the first temperature to a second temperature, which is higher than the first temperature, while the hydrogen gas is supplied to the substrate, without supplying any oxygen-containing gas; and
   (c) forming an oxide film on the substrate, on which (a) and (b) have been performed, by alternately repeating, while the temperature of the substrate is maintained at the second temperature:
   supplying the precursor gas to the substrate; and
   supplying the oxygen-containing gas to the substrate, without supplying any hydrogen-containing gas.

15. A non-transitory computer-readable recording medium storing a program configured to cause, by a computer, a substrate processing apparatus to perform a process comprising:
   (a) supplying a hydrogen gas to a substrate set to a first temperature in a process chamber of the substrate processing apparatus, without supplying any oxygen-containing gas;
   (b) changing a temperature of the substrate in the process chamber from the first temperature to a second temperature, which is higher than the first temperature, while the hydrogen gas is supplied to the substrate, without supplying any oxygen-containing gas; and
   (c) forming an oxide film on the substrate in the process chamber, on which (a) and (b) have been performed, by alternately repeating, while the temperature of the substrate is maintained at the second temperature:
   supplying a precursor gas to the substrate; and
   supplying an oxygen-containing gas to the substrate, without supplying any hydrogen-containing gas.

* * * * *